United States Patent
Lin et al.

(10) Patent No.: US 10,825,693 B2
(45) Date of Patent: **\*Nov. 3, 2020**

(54) CARRIER WARPAGE CONTROL FOR THREE DIMENSIONAL INTEGRATED CIRCUIT (3DIC) STACKING

(71) Applicant: Taiwan Semiconductor Manufacturing Company, Ltd., Hsinchu (TW)

(72) Inventors: Jing-Cheng Lin, Hsinchu (TW); Shih Ting Lin, Taipei (TW); Chen-Hua Yu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/410,842

(22) Filed: May 13, 2019

(65) Prior Publication Data
US 2019/0267255 A1    Aug. 29, 2019

Related U.S. Application Data

(60) Continuation of application No. 16/050,954, filed on Jul. 31, 2018, now Pat. No. 10,290,513, which is a
(Continued)

(51) Int. Cl.
*H01L 23/00*    (2006.01)
*H01L 25/065*   (2006.01)
(Continued)

(52) U.S. Cl.
CPC ............ *H01L 21/56* (2013.01); *H01L 21/561* (2013.01); *H01L 21/563* (2013.01); *H01L 21/568* (2013.01); *H01L 23/3128* (2013.01); *H01L 24/96* (2013.01); *H01L 24/97* (2013.01); *H01L 25/0657* (2013.01); *H01L 24/13* (2013.01);
(Continued)

(58) Field of Classification Search
CPC ....... H01L 24/96; H01L 24/97; H01L 21/561; H01L 25/0657; H01L 23/3128; H01L 21/563; H01L 21/568; H01L 2224/17181; H01L 24/92; H01L 24/83; H01L 24/81;
(Continued)

(56) References Cited

U.S. PATENT DOCUMENTS 6,452,278 B1    9/2002  DiCaprio et al.
7,655,501 B2    2/2010  Yang et al.
(Continued)

FOREIGN PATENT DOCUMENTS

CN    101202253 A    6/2008
CN    102024802 A    4/2011
(Continued)

*Primary Examiner* — Savitri Mulpuri
(74) *Attorney, Agent, or Firm* — Slater Matsil, LLP

(57) ABSTRACT

An embodiment method of forming a package-on-package (PoP) device includes temporarily mounting a substrate on a carrier, stacking a first die on the substrate, at least one of the die and the substrate having a coefficient of thermal expansion mismatch relative to the carrier, and stacking a second die on the first die. The substrate may be formed from one of an organic substrate, a ceramic substrate, a silicon substrate, a glass substrate, and a laminate substrate.

14 Claims, 12 Drawing Sheets

Related U.S. Application Data division of application No. 13/779,554, filed on Feb. 27, 2013, now Pat. No. 10,153,179.

(60) Provisional application No. 61/693,083, filed on Aug. 24, 2012.

(51) Int. Cl.
*H01L 21/56* (2006.01)
*H01L 23/31* (2006.01)

(52) U.S. Cl.
CPC .............. *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/131* (2013.01); *H01L 2224/16145* (2013.01); *H01L 2224/16225* (2013.01); *H01L 2224/17181* (2013.01); *H01L 2224/32145* (2013.01); *H01L 2224/32225* (2013.01); *H01L 2224/73204* (2013.01); *H01L 2224/81005* (2013.01); *H01L 2224/83005* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06562* (2013.01); *H01L 2225/06565* (2013.01); *H01L 2924/141* (2013.01); *H01L 2924/1431* (2013.01); *H01L 2924/1434* (2013.01); *H01L 2924/157* (2013.01); *H01L 2924/15311* (2013.01); *H01L 2924/15787* (2013.01); *H01L 2924/15788* (2013.01); *H01L 2924/18161* (2013.01); *H01L 2924/351* (2013.01); *H01L 2924/3511* (2013.01)

(58) Field of Classification Search
CPC ......... H01L 24/73; H01L 24/32; H01L 24/16; H01L 24/13
See application file for complete search history.

(56) References Cited

U.S. PATENT DOCUMENTS

| | | |
|---|---|---|
| 7,915,080 B2 | 3/2011 | Takahashi |
| 8,017,445 B1 | 9/2011 | Chang et al. |
| 8,304,874 B2 | 11/2012 | Lee et al. |
| 8,471,374 B2 | 6/2013 | Kim et al. |
| 9,064,883 B2 | 6/2015 | Meyer et al. |
| 2007/0096332 A1 | 5/2007 | Satoh et al. |
| 2010/0133704 A1 | 6/2010 | Marimuthu et al. |
| 2010/0244233 A1 | 9/2010 | Kim et al. |
| 2011/0024890 A1 | 2/2011 | Yang et al. |
| 2011/0062592 A1 | 3/2011 | Lee et al. |
| 2011/0068459 A1 | 3/2011 | Pagaila et al. |
| 2011/0266693 A1 | 11/2011 | Simmons-Matthews |
| 2011/0278721 A1 | 11/2011 | Choi et al. |
| 2011/0278732 A1 | 11/2011 | Yu et al. |
| 2011/0287582 A1 | 11/2011 | Shimada et al. |
| 2012/0032340 A1 | 2/2012 | Choi et al. |
| 2012/0070936 A1 | 3/2012 | Guha et al. |
| 2012/0070939 A1 | 3/2012 | Dunne et al. |
| 2012/0074585 A1 | 3/2012 | Koo et al. |
| 2012/0074587 A1 | 3/2012 | Koo et al. |
| 2012/0111923 A1 | 5/2012 | Lee et al. |
| 2012/0181673 A1 | 7/2012 | Pagaila et al. |
| 2013/0155639 A1 | 6/2013 | Ogawa et al. |
| 2013/0214401 A1 | 8/2013 | Lin et al. |
| 2013/0277841 A1 | 10/2013 | Lii et al. |

FOREIGN PATENT DOCUMENTS

| | | |
|---|---|---|
| CN | 102456588 A | 5/2012 |
| CN | 102543772 A | 7/2012 |
| KR | 20100109241 A | 10/2010 |
| KR | 20101184470 | 9/2012 |
| WO | 2008129424 A | 10/2008 |

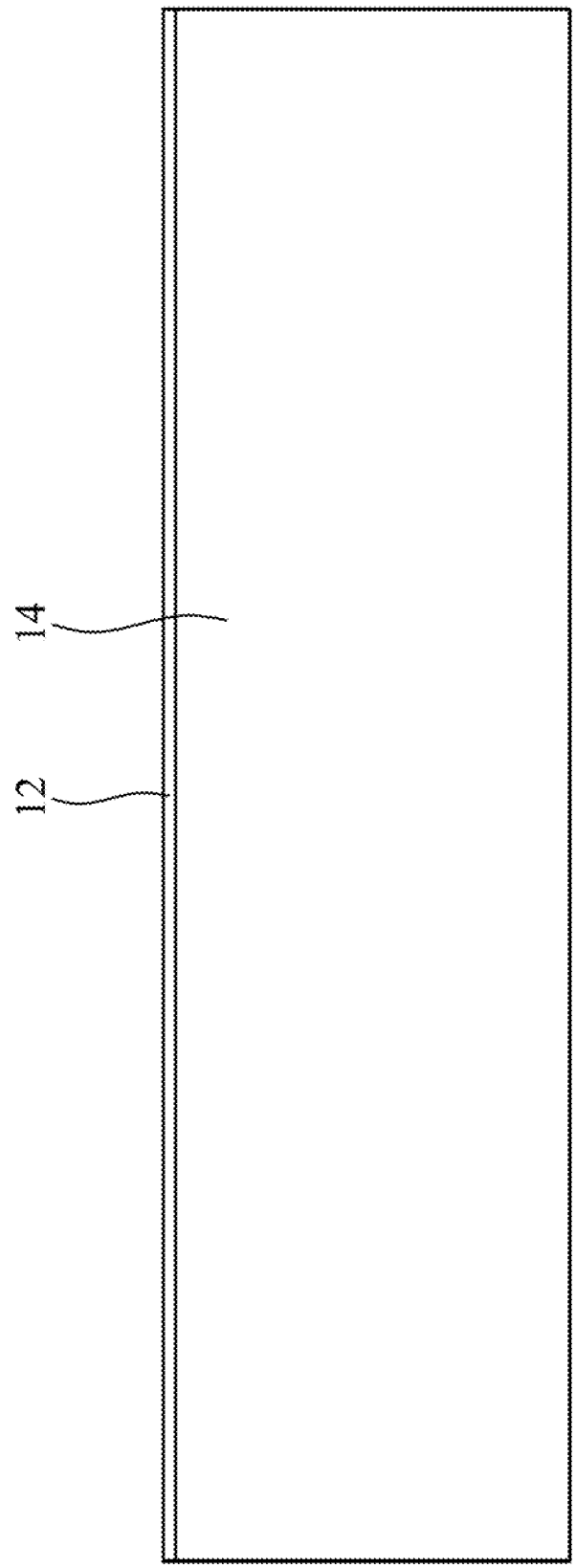

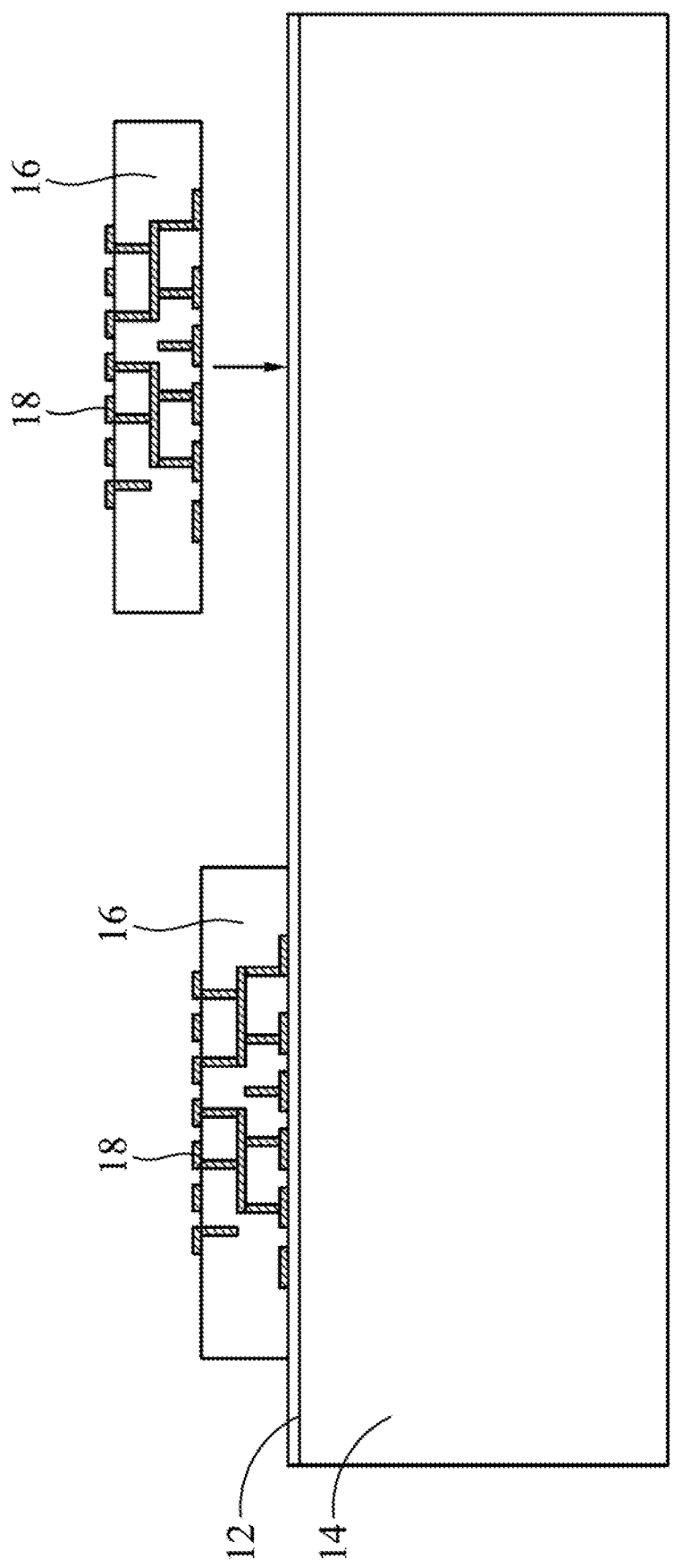

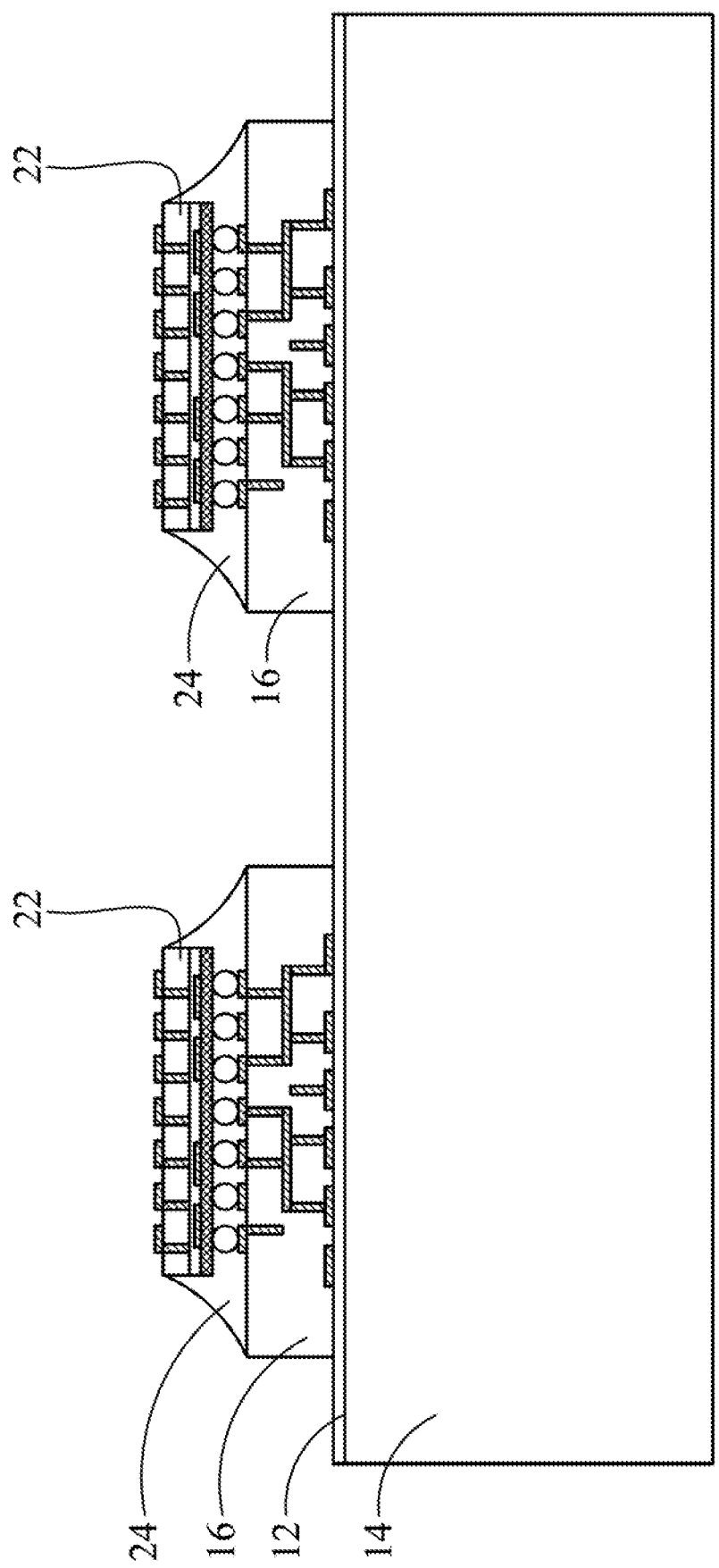

CARRIER WARPAGE CONTROL FOR THREE DIMENSIONAL INTEGRATED CIRCUIT (3DIC) STACKING

CROSS-REFERENCE TO RELATED APPLICATIONS

This application is a continuation of U.S. patent application Ser. No. 16/050,954, filed on Jul. 31, 2018, which is a divisional of U.S. patent application Ser. No. 13/779,554, filed on Feb. 27, 2013 and entitled "Carrier Warpage Control for Three Dimensional Integrated Circuit (3DIC) Stacking," now U.S. patent Ser. No. 10/153,179, issued Dec. 11, 2018, which claims the benefit of U.S. Provisional Application No. 61/693,083, filed on Aug. 24, 2012, entitled "Carrier Warpage Control for 3DIC Stacking," which applications are hereby incorporated herein by reference.

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic packages.

Unfortunately, conventional processes used to fabricate the PoP devices may not be able to sufficiently prevent the packages from warping. This is particularly true when relatively thin dies or integrated circuits are being stacked.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1A-1I collectively illustrate an embodiment method of forming a PoP device using a carrier to inhibit or prevent warping in stacked dies;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently present embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to present embodiments in a specific context, namely a package-on-package (PoP) semiconductor device. The concepts in the disclosure may also apply, however, to other semiconductor structures or circuits.

Figure 1C:
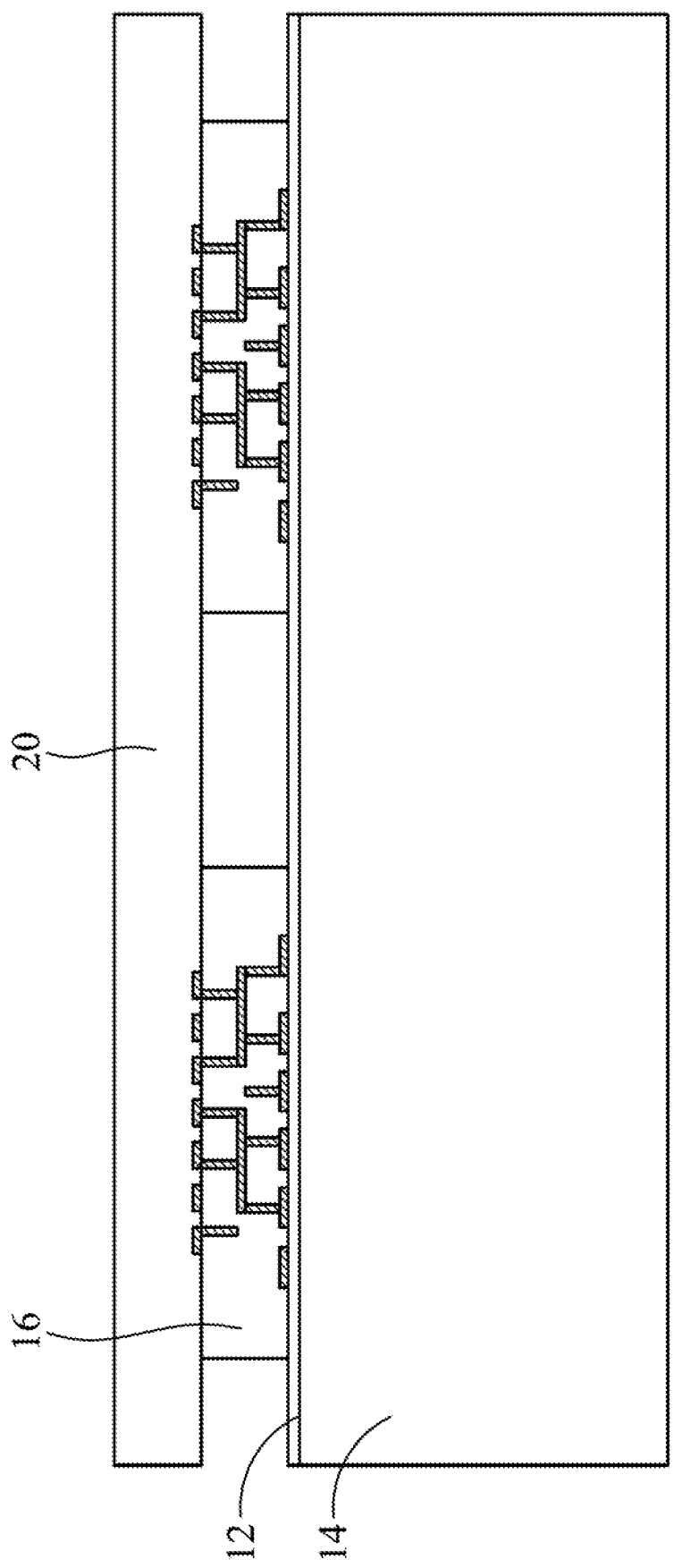

Referring now to FIGS. 1A-1I, an embodiment method of forming a PoP device 10 (FIGS. 2-4) is collectively illustrated. As shown in FIG. 1A, glue 12 or another suitable bonding material is deposited or formed on a carrier 14. In an embodiment, the carrier 14 is formed from glass, silicon, a material having a low coefficient of thermal expansion, or another suitable carrier material. Indeed, the carrier 14 is generally a higher modulus material with good stiffness.

Referring now to FIG. 1B, a substrate 16 is temporarily mounted on the carrier 14 using the glue 12 or other suitable bonding material. In an embodiment, the substrate 16 is an organic substrate, a ceramic substrate, a silicon substrate, a glass substrate, or a laminate substrate having or supporting metal interconnects 18 or metallization. In an embodiment, the substrate 16 is formed from an epoxy, a resin, or another material.

Referring now to FIG. 1C, in an embodiment a pressure anneal is performed after the substrate 16 has been temporarily mounted on the carrier 14 as shown in FIG. 1B. The pressure anneal generally biases the substrate 16 toward the carrier 14. This ensures that the substrate 16 is securely mounted, albeit temporarily, on the carrier 14. In an embodiment, the pressure anneal of FIG. 1C is performed using a pressure anneal cap 20 along with heating. In an embodiment, pressure anneal may be performed later in the embodiment method illustrated in FIGS. 1A-1I. For example, the pressure anneal may be performed on a wafer, on a panel, on a single unit, or on multiple units. In addition, in an embodiment the pressure anneal includes pressure only without the application of heat.

Referring now to FIG. 1D, after the pressure anneal cap 20 of FIG. 1C has been removed, a first die 22 is attached to the substrate 16 using, for example, solder balls and corresponding contact pads. The first die 22 may include logic components (a logic integrated circuit, analog circuit, etc.), a memory component, and so on. The substrate 16 and/or the die 22 generally have a material coefficient of thermal expansion mismatch relative to the carrier 14. As will be more fully explained below, any warping of, for example, dies or other semiconductor structures stacked on or over the substrate 16 is inhibited or prevented.

After placing the first die 22, an underfill material 24 may be flowed between the first die 22 and the substrate 16. In an embodiment, the underfill material 24 is omitted between the first die 22 and the substrate 16.

Figure 1E:
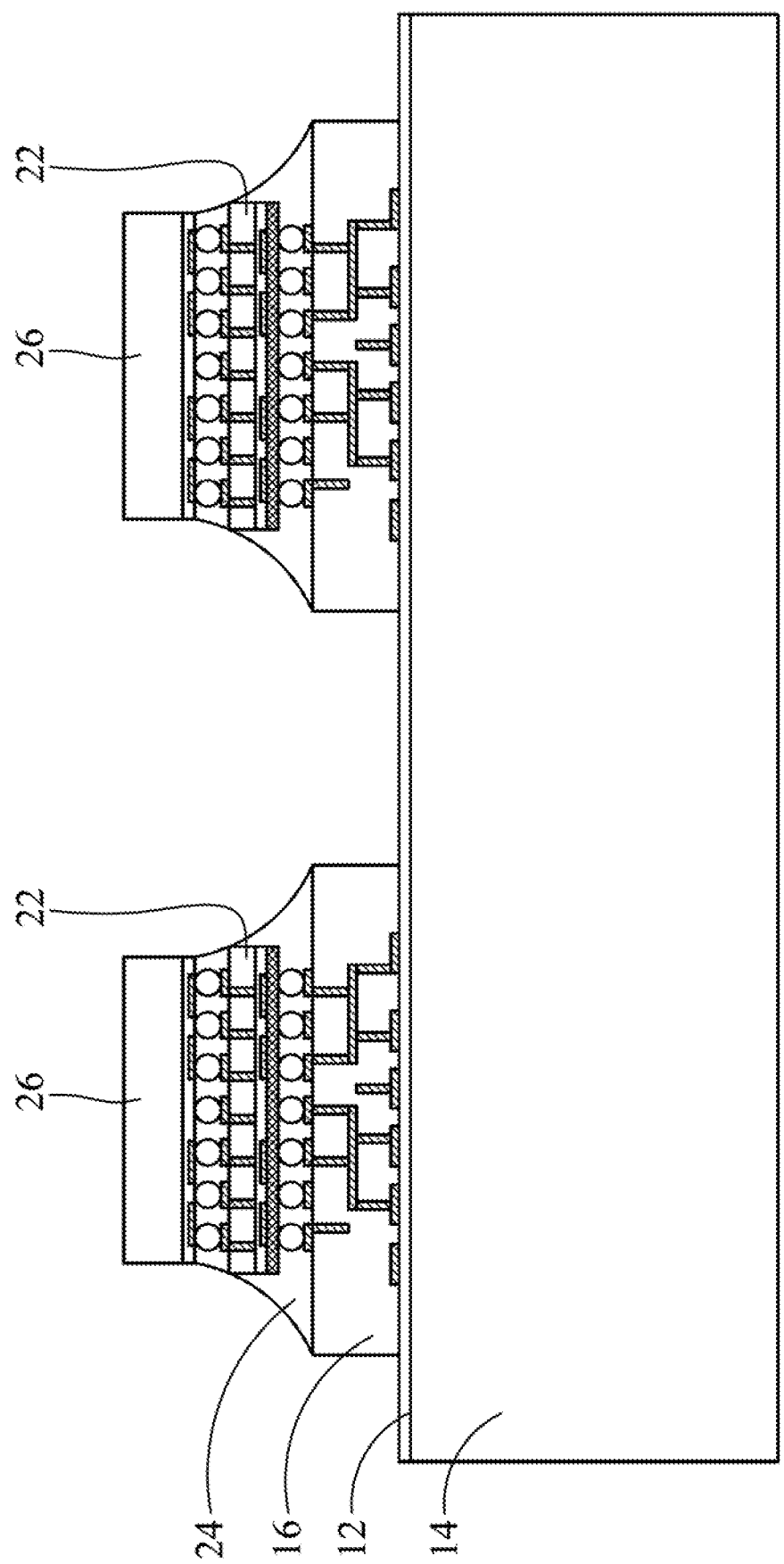

Referring now to FIG. 1E, after the first die 22 has been mounted, a second die 26 is attached over the first die 22 using, for example, solder balls and corresponding contact pads. The second die 26 may include logic components (a logic integrated circuit, analog circuit, etc.), a memory component, and so on. Notably, the stacking of the second die 26 upon the first die 22 generally forms the PoP devices 10.

After placing the second die 26 as shown in FIG. 1E, an underfill material 24 may be flowed between the second die 26 and the first die 22. In an embodiment, the underfill material 24 is omitted. As will be more fully explained below, in an embodiment the second die 26 may be horizontally offset relative to the first die 22 to provide the second die 26 with an overhang.

Figure 1F:
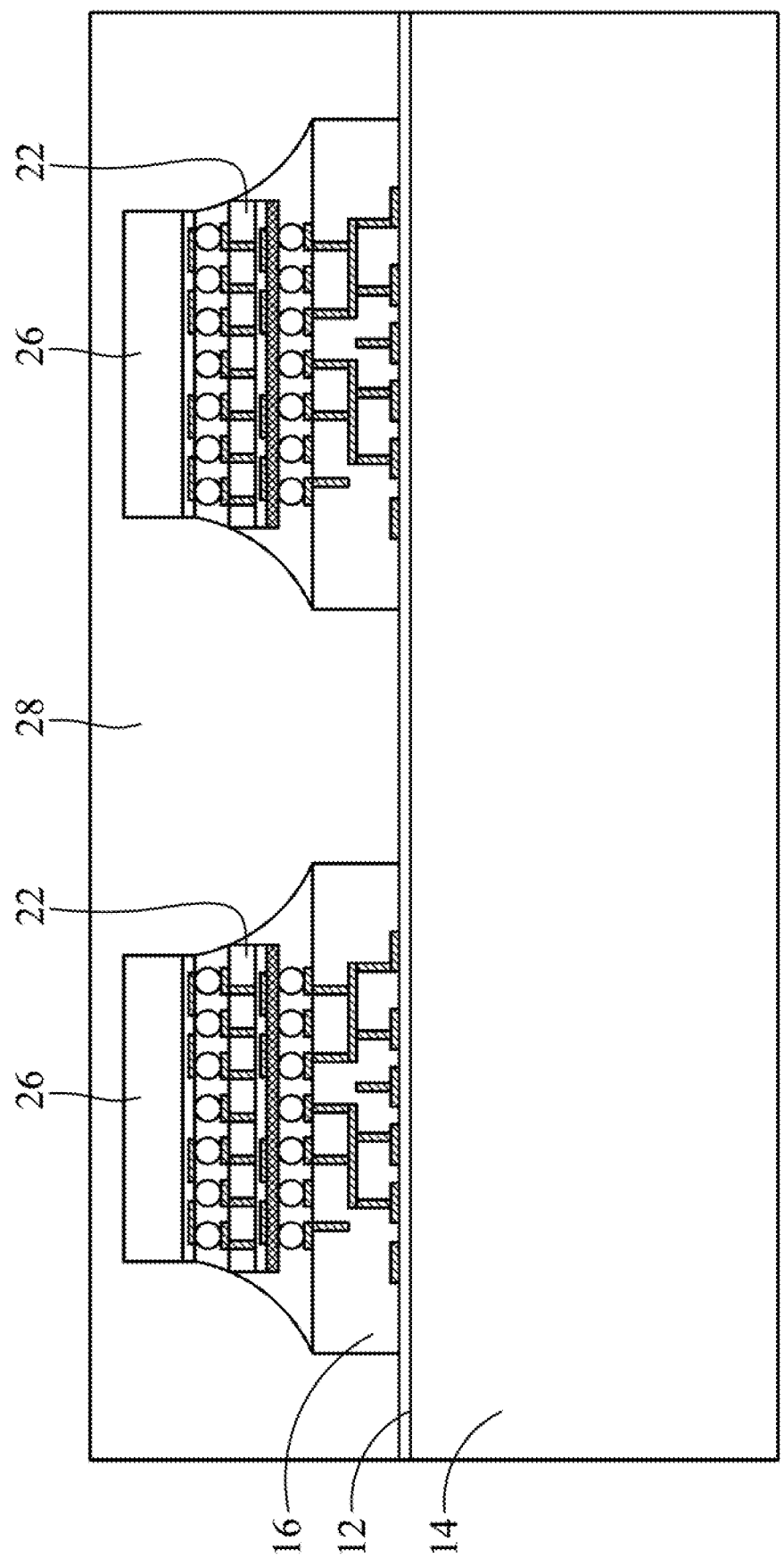

Referring now to FIG. 1F, after the second die 26 has been mounted, a molding material 28 is formed over, for example, exposed portions of the substrate 16, the first die 22, and the second die 26. In an embodiment, the molding material 28 is also formed over the glue 12 disposed on the carrier 14 and adjacent to the substrate 16. In an embodiment, the molding material 28 generally encapsulates the first and second dies 22, 26.

Figure 1G:
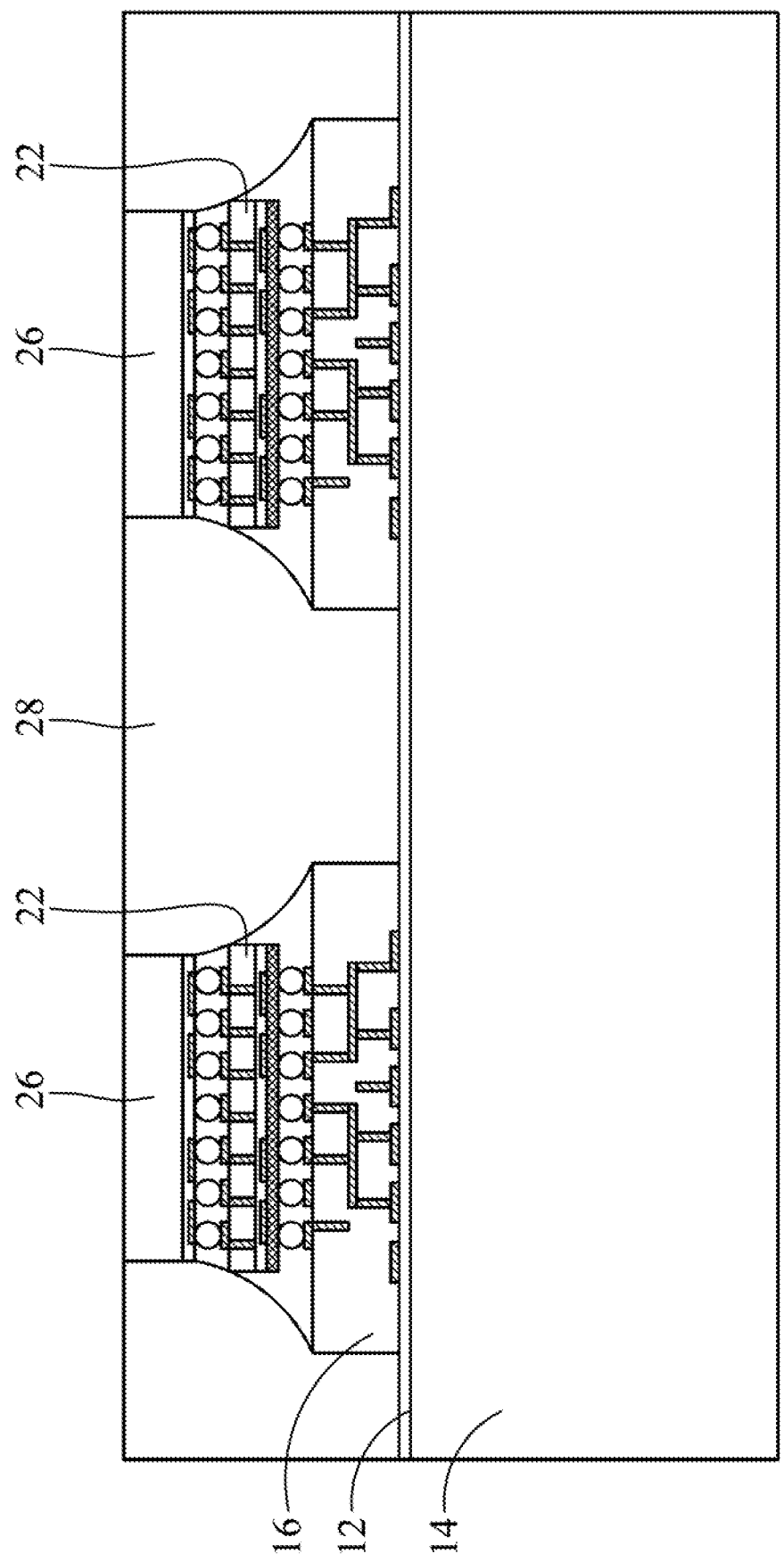

Referring now to FIG. 1G, after the molding material 28 has been formed over the first and second dies 22, 26, a grinding process is performed to remove an upper portion of the molding material 28. As shown, the grinding process may expose a top surface of the second die 26. However, in an embodiment, the grinding process may leave a portion or thin layer of the molding material 28 disposed over the second die 26.

Figure 1H:
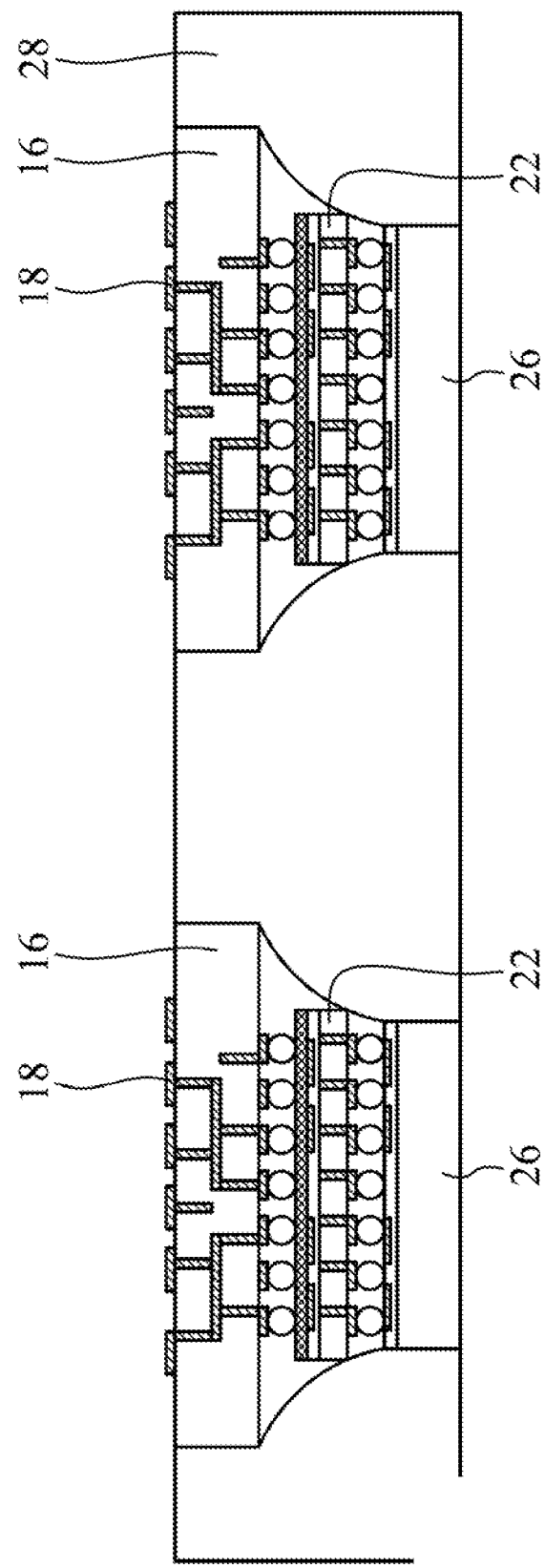

Referring now to FIG. 1H, after the grinding process has been performed, the assembly is flipped over and a de-bonding process is performed to remove the carrier 14 from the substrate 16. In addition, a cleaning process is performed to remove the glue 12 from the substrate 16 and the molding material 28. Once the de-bonding and cleaning processes have been performed, contact pads from the metal interconnects 18 of the substrate 16 are exposed.

Figure 1I:
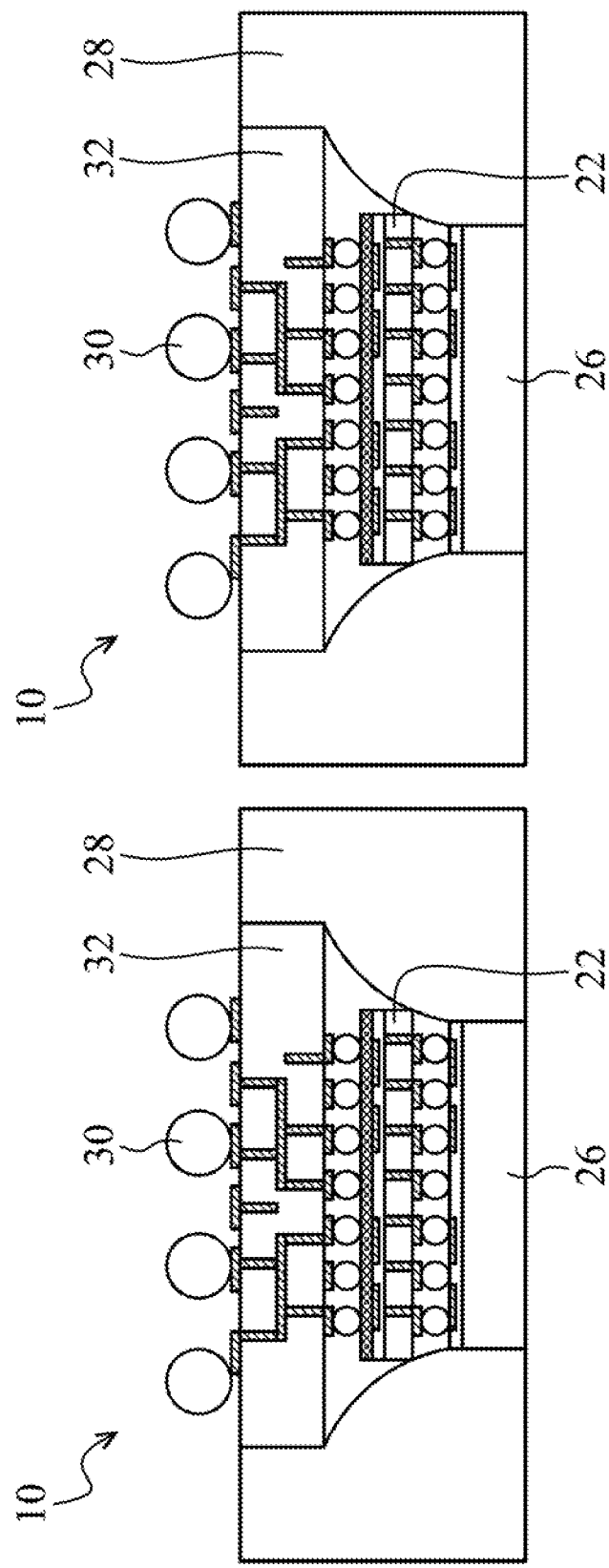

Referring now to FIG. 1I, after the de-bonding and cleaning processes have been performed, a ball mount process is performed to form an array of solder balls 30 on the contact pads from the metal interconnects 18 of the substrate 16. In addition, a wafer saw process is performed to separate the PoP devices 10 from each other. As shown in FIG. 1I, after the wafer saw process a portion of the molding material 28 still covers the sidewalls 32 of the substrate 16. However, in an embodiment the wafer saw process removes the molding material 28 from the sidewalls 32 of the substrate 16.

Figure 2:
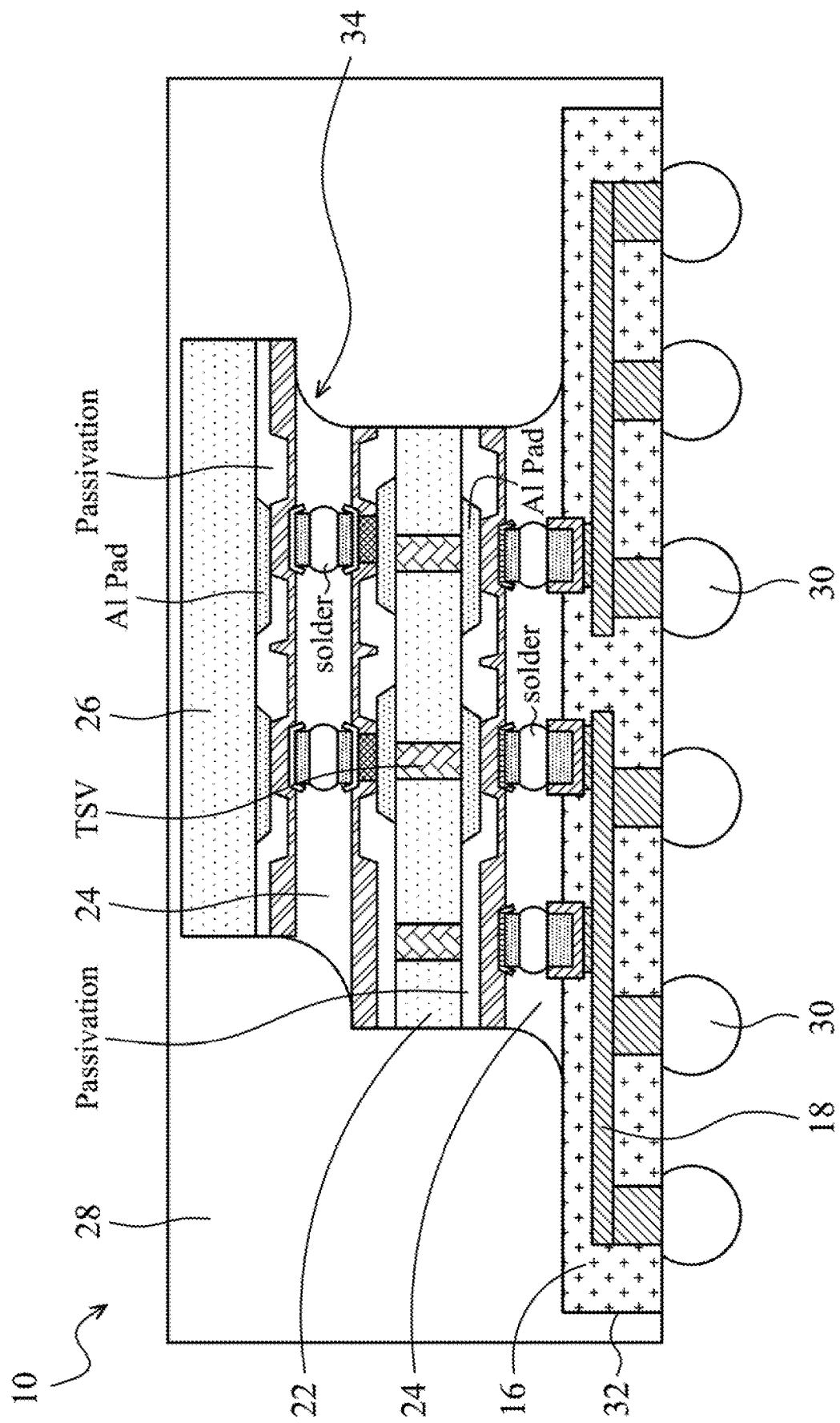
FIG. 2 illustrates a cross sectional view of an embodiment PoP device formed using the method of FIGS. 1A-1I.

Referring to FIG. 2, an embodiment PoP device 10 formed using an embodiment method is illustrated. As shown, the PoP device 10 includes a first die 22 stacked on the substrate 16 and a second die 26 stacked on the first die 22. In an embodiment, the second die 26 is horizontally offset relative to the first die 22 to provide the second die 26 with the overhang 34 noted above.

In an embodiment, the underfill material 24 is disposed between the substrate 16 and the first die 22 as well as between the first die 22 and the second die 26. In an embodiment, the underfill material 24 is disposed between the substrate 16 and the first die 22 only. In an embodiment, the underfill material 24 is disposed between the first die 22 and the second die 26 only. In addition, the molding material 28 of the PoP device 10 has been formed around portions of the substrate 16, the first die 22, and the second die 26. In an embodiment, the molding material 28 is omitted.

Still referring to FIG. 2, the substrate 16 of the PoP device 10 supports metal interconnects 18 and/or other connection structures (e.g., under bump metallization) used to electrically couple the solder balls 30 (i.e., the ball grid array) to the first die 22. The PoP device 10 may also include other structures, layers, or materials such as, for example, passivation layers, through silicon vias (TSVs), aluminum pads, solder, and so on.

Figure 3:
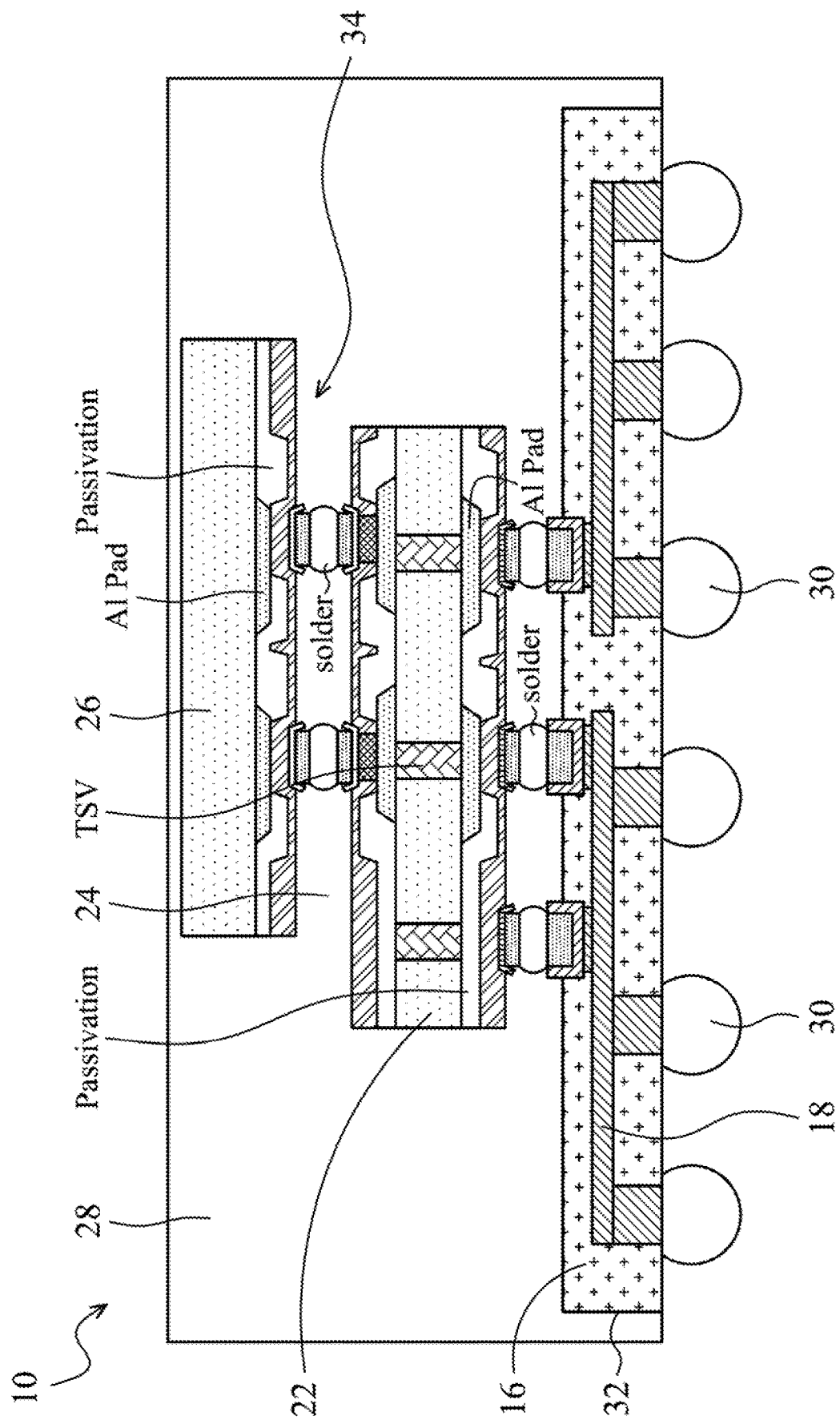
FIG. 3 illustrates a cross sectional view of an embodiment PoP device formed using the method of FIGS. 1A-1I without any underfill.

Referring now to FIG. 3, in an embodiment the underfill material 24 of FIG. 2 has been omitted from the PoP device 10 and replaced by the molding material 28. In other words, the molding material 28 functions or preforms as an underfill in the embodiment PoP device 10 of FIG. 3.

Figure 4:
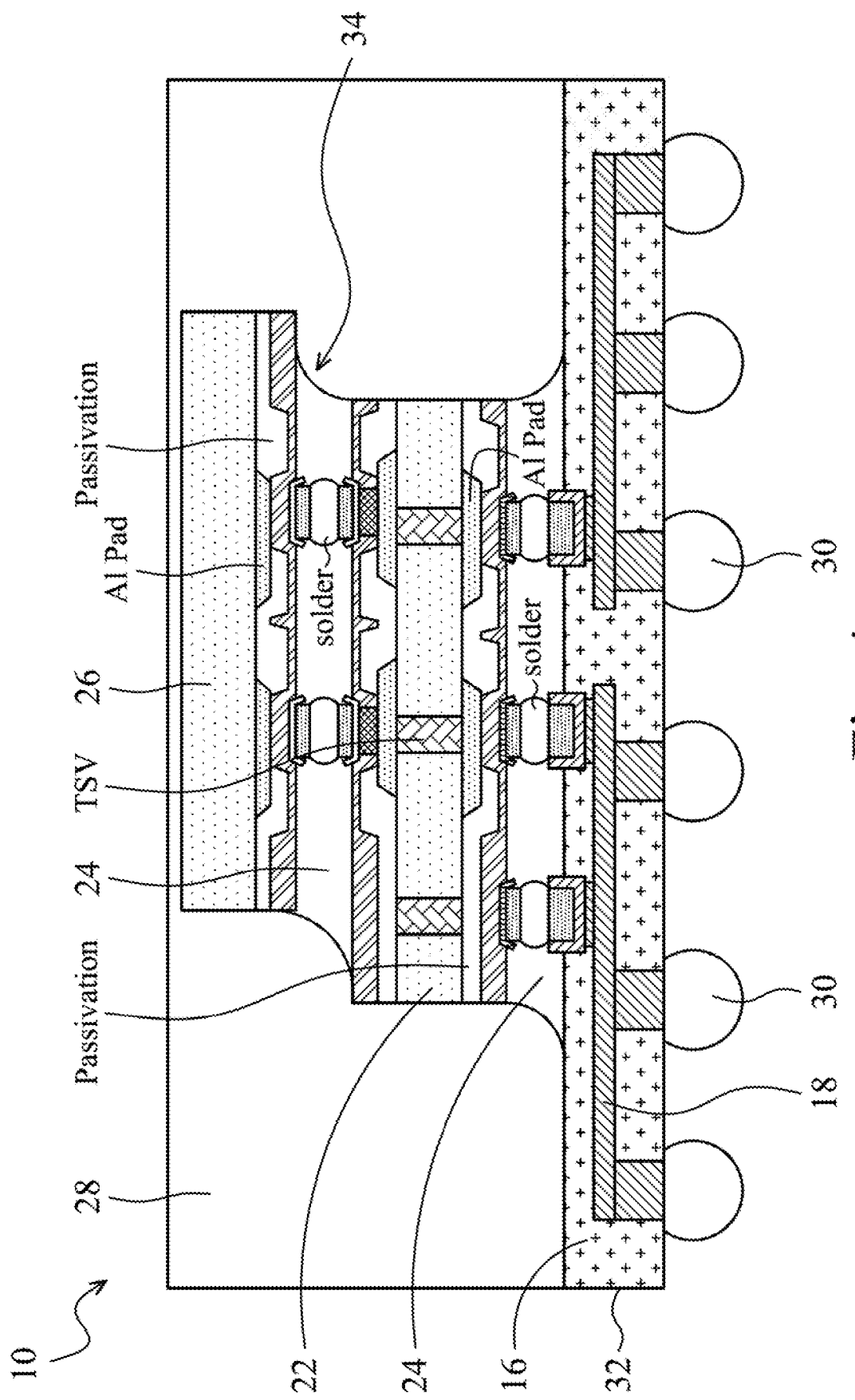
FIG. 4 illustrates a cross sectional view of an embodiment PoP device formed using the method of FIGS. 1A-1I without any molding on sidewalls of the substrate.

Referring now to FIG. 4, in an embodiment the molding material 28 is left off or removed from sidewalls 32 of the substrate 16. By way of example, the molding material 28 may not be formed on the sidewalls 32 when the molding material 28 is deposited during the molding process of FIG. 1F. In other words, the molding material 28 is prevented from forming on the sidewalls 32. In another example, the molding material 28 may be removed from the sidewalls 32 of the substrate 16 using the wafer saw process of FIG. 1I. In other words, the wafer saw removes the molding material 28 from the sidewalls 32.

It should be recognized that the embodiment methods and PoP device 10 provide numerous advantages. Indeed, by using the carrier 14 during the stacking of dies 22, 26 warping is inhibited or prevented, even when relatively thin dies are stacked. In addition, multiple dies may be stacked, either with or without an overhang.

An embodiment method of forming a package-on-package (PoP) device includes temporarily mounting a substrate on a carrier, stacking a first die on the substrate, at least one of the die and the substrate having a coefficient of thermal expansion mismatch relative to the carrier, and stacking a second die on the first die.

An embodiment method of forming a package-on-package (PoP) device includes temporarily mounting a substrate on a carrier, stacking a plurality of dies over the substrate, at least one of the plurality of dies and the substrate having a coefficient of thermal expansion mismatch relative to the carrier, and removing the carrier after the plurality of dies have been stacked.

A embodiment method of forming a package-on-package (PoP) device includes temporarily mounting a substrate on a carrier, stacking a first die on the substrate, at least one of the first die and the substrate having a coefficient of thermal expansion mismatch relative to the carrier, stacking a second die on the first die, the second die horizontally offset relative to the first die to provide the second die with an overhang, and flowing an underfill material between the first die and the substrate and between the first die and the second die.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A package-on-package (PoP) device comprising:
   a first die over and electrically connected to a first substrate, wherein the first die comprises:
   a second substrate;
   a through via extending through the second substrate;
   a first passivation layer on a first side of the second substrate;
   a second passivation layer on a second side of the second substrate;
   a first conductive feature on the first side of the first substrate and electrically connected to the through via, wherein a sidewall of the first conductive feature is spaced part from a sidewall of the first passivation layer; and
   a second conductive feature on the second side of the first substrate and electrically connected to the through via, wherein a sidewall of the second conductive feature is spaced part from a sidewall of the second passivation layer;

a second die over the first die and electrically connected to the first die, wherein the second die is horizontally offset relative to the first die;

a first aluminum pad between the first conductive feature and the through via;

a second aluminum pad between the second conductive feature and the through via; and a first underfill between the first die and the second die.

2. The PoP device of claim 1, further comprising:

a first solder region between the first conductive feature and the first substrate; and a second solder region between the second conductive feature and the second die.

3. The PoP device of claim 1, wherein the first conductive feature extends through the first passivation layer to the first aluminum pad, and wherein the second conductive feature extends through the second passivation layer to the second aluminum pad.

4. The PoP device of claim 1, wherein a portion of a bottom surface of the second die is free of the first underfill.

5. The PoP device of claim 1 further comprising a molding material over the first substrate, around the first die, and around the second die, wherein the molding material physically contacts a bottom surface of the second die.

6. The PoP device of claim 5, wherein an interface between the first underfill and the molding material intersects the bottom surface of the second die.

7. The PoP device of claim 5, wherein sidewalls of the first substrate are free of the molding material.

8. The PoP device of claim 1, wherein the first substrate is an organic substrate, a ceramic substrate, a silicon substrate, a glass substrate, or a laminate substrate having conductive features disposed therein.

9. The PoP device of claim 1, wherein the first conductive feature comprises three different conductive materials.

10. A package-on-package (PoP) device comprising a substrate having a conductive feature;

a first die attached to the substrate, wherein the first die has a thickness measured along a first direction between an uppermost surface of the first die and a lowermost surface of the first die, wherein the first die comprises:

a through via, wherein a length of the through via, measured along the first direction, is smaller than the thickness of the first die, wherein the through via of the first die is electrically coupled to the conductive feature of the substrate, wherein the through via of the first die is disposed between the uppermost surface of the first die and the lowermost surface of the first die without contacting the uppermost surface and without contacting the lowermost surface;

a first aluminum pad on the uppermost surface of the first die; and a second aluminum pad on the lowermost surface of the first die, wherein the through via of the first die is disposed between, and contacts, the first aluminum pad and the second aluminum pad;

a first underfill material between the first die and the substrate;

a second die attached to the first die, the first die being between the second die and the substrate, a first portion of the second die being disposed within lateral extents of the first die, a second portion of the second die being disposed outside the lateral extents of the first die, wherein a connector of the second die is electrically coupled to the through via of the first die;

a second underfill material between the first die and the second die; and a molding material over the substrate and contacting the substrate, the molding material surrounding the first die, the second die, the first underfill material, and the second underfill material.

11. The PoP device of claim 10, further comprising:

a first solder region between the substrate and the first die; and a second solder region between the first die and the second die.

12. The PoP device of claim 11, wherein sidewalls of the substrate is free of the molding material.

13. A package-on-package (PoP) device comprising:

a substrate having conductive lines and vias;

a second die on a first side of the substrate, the second die electrically coupled to the substrate;

a first die between the substrate and the second die, wherein the first die is electrically coupled between the substrate and the second die, wherein a first portion of the second die extends within lateral extents of the first die defined by sidewalls of the first die, and a second portion of the second die extends beyond the lateral extents of the first die, wherein the first die comprises:

a first substrate with an upper surface and a lower surface; a first aluminum pad extending along the upper surface of the first substrate and a second aluminum pad extending along the lower surface of the first substrate;

passivation layers on the upper surface and on the lower surface of the first substrate, wherein the passivation layers cover a portion of the first aluminum pad and a portion of the second aluminum pad;

a through via in the first substrate, wherein the through via is between the first aluminum pad and the second aluminum pad, wherein the through via is electrically coupled to the substrate and the second die;

a first connector at the upper surface of the first die, the first connector electrically coupled to the first aluminum pad, wherein the first connector is electrically coupled to a connector of the second die; and a second connector at the lower surface of the first die, the second connector electrically coupled to the second aluminum pad, wherein the second connector is electrically coupled to a conductive line of the substrate; and a molding material on the substrate and contacting the substrate, wherein the molding material surrounds the first die and the second die.

14. The PoP device of claim 13, further comprising solder balls on a second side of the substrate opposing the first side of the substrate.

* * * * *